United States Patent
Yoshihara et al.

(10) Patent No.: US 7,444,525 B2
(45) Date of Patent: Oct. 28, 2008

(54) METHODS AND APPARATUS FOR REDUCING LEAKAGE CURRENT IN A DISABLED SOI CIRCUIT

(75) Inventors: Hiroshi Yoshihara, Round Rock, TX (US); Sang Hoo Dhong, Austin, TX (US); Osamu Takahashi, Round Rock, TX (US); Takaaki Nakazato, Austin, TX (US)

(73) Assignees: Sony Computer Entertainment Inc., Tokyo (JP); International Business Machines Corporation, Armonk, NY (US); Toshiba America Electronic Components, Inc., Irvine, CA (US)

( * ) Notice: Subject to any disclaimer, the term of this patent is extended or adjusted under 35 U.S.C. 154(b) by 375 days.

(21) Appl. No.: 11/137,234

(22) Filed: May 25, 2005

(65) Prior Publication Data
US 2006/0270173 A1   Nov. 30, 2006

(51) Int. Cl.
*G06F 1/00* (2006.01)
*G06F 1/26* (2006.01)
*G06F 1/32* (2006.01)
(52) U.S. Cl. ...................... 713/300; 713/324
(58) Field of Classification Search ............... 713/300, 713/324
See application file for complete search history.

(56) References Cited

U.S. PATENT DOCUMENTS

| | | | |
|---|---|---|---|
| 5,726,946 A | 3/1998 | Yamagata | |
| 5,880,604 A | 3/1999 | Kawahara | |
| 5,949,720 A * | 9/1999 | Brady | 365/189.06 |
| 5,996,083 A * | 11/1999 | Gupta et al. | 713/322 |
| 6,526,491 B2 | 2/2003 | Suzuoki et al. | |
| 6,545,515 B2 * | 4/2003 | Takahashi et al. | 327/110 |
| 6,864,524 B2 * | 3/2005 | Masleid et al. | 257/296 |
| 2001/0035774 A1 | 11/2001 | Kotani | |
| 2002/0059509 A1 * | 5/2002 | Sasaki | 712/19 |
| 2004/0221185 A1 * | 11/2004 | Bose et al. | 713/300 |
| 2005/0015660 A1 | 1/2005 | Sutardja et al. | |
| 2005/0036259 A1 | 2/2005 | Hokenmaier | |
| 2005/0040881 A1 | 2/2005 | Brown | |

OTHER PUBLICATIONS

International Search Report Reference # PCT/US2006/019534.

* cited by examiner

*Primary Examiner*—Thomas Lee
*Assistant Examiner*—Ji H. Bae
(74) *Attorney, Agent, or Firm*—Matthew B. Dernier; Kaplan Gilman Gibson & Dernier LLP

(57) ABSTRACT

Methods and apparatus provide for enabling a digital circuit by biasing at least one switch transistor ON such that a voltage potential of a virtual ground node is substantially equal to a voltage potential of a ground node for a power supply to the digital circuit, wherein the digital circuit is implemented using a plurality of transistors in a silicon-on-insulator (SOI) arrangement and at least some of the transistors are referenced to the virtual ground node; and disabling the digital circuit by biasing a gate terminal of the switch transistor below the voltage potential of the ground node.

16 Claims, 9 Drawing Sheets

METHODS AND APPARATUS FOR REDUCING LEAKAGE CURRENT IN A DISABLED SOI CIRCUIT

BACKGROUND

The present invention relates to methods and apparatus for reducing leakage current in a disabled silicon-on-insulator (SOI) circuit.

Large scale integrated circuits are being designed to accommodate an ever increasing number of circuits in order to achieve higher and higher functionality. For example, digital circuits (or analog circuits) are being designed with very high numbers of gates and other functional circuitry to meet processing objectives in the marketplace. As the complexity of integrated circuits (ICs) continue to increase, however, the number of transistors and other components used to implement the circuitry also increases and the probability of a faulty component or circuit occurring in an IC approaches one. The existence of a faulty circuit or component may require that the IC be discarded.

It has been proposed to use redundant circuits on the IC in order to permit replacement of the circuitry containing a faulty component. For example, FIG. 1 illustrates an IC 10 employing digital circuit A, digital circuit B, digital circuit C, and digital circuit D, where one or more of the circuits may be redundant. Thus, even when a fault occurs, the IC 10 may be salvaged by enabling the redundant circuit. This can increase the IC yield and save the IC manufacturer a considerable amount of money. While the redundant circuit(s) may be activated and used in place of the faulty components, the faulty component may be deactivated. Conventional techniques for activating good circuits and deactivating faulty circuits include blowing fuses, such as electrical fuses (e-fuses) and/or laser-trimmed fuses.

The components or circuits of an IC may be faulty due to improper fabrication. For example, an imperfection may have been present on the substrate during fabrication or the fabrication procedure itself may be faulty. Improperly fabricated ICs may be discovered during IC testing, prior to packaging. If a faulty component is discovered on an IC during pre-packaging IC testing, the faulty component may be deactivated and a redundant circuit activated to take its place through the blowing of certain fuses, preferably, laser fuses since access to the IC is possible because the IC has yet to be packaged.

ICs may also be damaged after the pre-packaging IC testing. The components or circuits of an IC may be faulty due to damage during the packaging of the IC, for example, when the die is cut from the wafer, when the wafer is cleaned, when the die is bonded to the packaging, and so forth. ICs that become faulty due to packaging are usually not discovered until post-packaging testing. Since the packaging of an IC can be a considerable amount of the overall cost of manufacturing the IC, simply discarding a faulty IC could be expensive. A conventional technique proposes the use of additional redundant circuits that can be activated in place of the faulty components discovered in post-packaging IC testing. These additional redundant circuits can be activated through the use of electrical fuses (e-fuses), rather than laser fuses, since direct access to the IC is not possible. This can permit the use of a packaged IC that would have otherwise been discarded.

In order to minimize the complexity of the power and clock distribution networks of the IC, the redundant circuitry usually shares common power and clock distribution networks with the other circuits of the IC. Thus, in the majority of IC the redundant circuitry is being actively clocked and powered although it is not being used. This can increase power consumption of the IC. Similarly, when a circuit containing a fault is disabled, it is still actively clocked and powered, which also contributes to the power consumption problem.

U.S. Patent Publication 2005-0036259, which is incorporated herein by reference, addresses the power consumption problem by proposing to gate the signaling and power to the redundant circuitry, such that the unused redundant circuitry does not receive clock signals or power. The decision as to whether to enable or disable the signaling and power to the unused redundant circuitry is based on the state of fuses used to enable/disable the redundant circuitry.

Unfortunately, the gating of clock signals and power (as well as other signaling) to unused redundant circuitry of an IC is not always practical or desirable. Thus, another technique to permit enabling and disabling of circuitry on an IC is needed that limits unnecessary power dissipation by disabled circuitry.

SUMMARY OF THE INVENTION

It is noted that some ICs are designed with a plurality of circuits that are intended more for parallel functionality as opposed to redundancy. For example, in a parallel processing system, a number of processing circuits may be disposed in an IC, where each of the processors may operate in series or parallel to achieve a processing objective. While the processors may be redundant in the sense that they can perform the same functions, they are primarily provided for operation in parallel (and/or series) to increase processing performance.

By way of example, a multiprocessing system may have a potential of eight valid sub-processing units (SPUs processors) in a common IC. As discussed above, some of the SPUs may be faulty and, therefore, the overall performance of the IC may be reduced. Instead of enabling a redundant SPU to replace the faulty SPU, one or more embodiments of the invention contemplate disabling the faulty SPU and using the reduced performance multiprocessing system in an application (e.g., a product) that does not require a full compliment of SPUs. For example, a high performance video game product may require a full complement of SPUs; however, a digital television (DTV) might not require a full complement of SPUs. Depending on the complexity of the application in which the multiprocessing system is to be used, a lesser number of SPU processors may be employed by disabling the faulty SPU processors and using the resulting multiprocessing system in a less demanding environment (such as a DTV).

Although, disabling the unwanted SPU processors reduces the power dissipation within the CELL processor, conventional techniques have not adequately disconnected unwanted SPU processors from the power supply. Thus, one or more embodiments of the invention contemplate providing a means for disabling the unwanted SPU that also considerably reduces the power dissipation thereof by substantially interrupting power supply current from flowing through the SPU.

In accordance with one or more further embodiments of the invention, an SPU may be disabled even though it is not faulty. Indeed, in order to reduce power consumption in a particular application, one or more SPUs may be disabled when the application does not require a full complement of SPUs to achieve its performance goals.

In accordance with one or more embodiments of the present invention, methods and apparatus provide for: enabling a digital circuit by biasing at least one switch transistor ON such that a voltage potential of a virtual ground node is substantially equal to a voltage potential of a ground node for a power supply to the digital circuit, wherein the digital circuit is implemented using a plurality of transistors in a silicon-on-insulator (SOI) arrangement and at least some of the transistors are referenced to the virtual ground node; and disabling the digital circuit by biasing a gate terminal of the switch transistor below the voltage potential of the ground node.

The disabling may include biasing the gate of the switch transistor to between about −0.05 V and about −0.3 V with respect to the ground node; biasing the gate of the switch transistor to between about −0.1 V and about −0.4 V with respect to the ground node; biasing the gate of the switch transistor to between about −0.2 V and about −0.5 V with respect to the ground node; and/or biasing the gate of the switch transistor to at least about 0.1 V below a voltage potential of the ground node.

The methods and apparatus may also provide for controlling a substrate voltage of the SOI arrangement as a function of a threshold voltage of the switch transistor. Alternatively or in addition, the methods and apparatus may also provide for controlling a leakage current of the switch transistor as a function of a biasing voltage potential applied to the gate of the switch transistor.

In alternative embodiments, the methods and apparatus may further provide for: providing a plurality of such digital circuits, each digital circuit having a respective virtual ground node; providing at least one such switch transistor coupled from each of the virtual ground nodes to the ground node; and independently disabling one or more of the digital circuits by biasing the gate terminal(s) of the associated switch transistor(s) below the voltage potential of the ground node.

In some embodiments, at least some of the digital circuits may comprise a plurality of processors, each processor: (i) being capable of operative communication with a main memory, (ii) being implemented using a plurality of transistors in the silicon-on-insulator (SOI) arrangement, and (iii) having at least some of its transistors referenced to a respective virtual ground node. In this regard, the at least one switch transistor may include at least one switch transistor coupled from each of the virtual ground nodes to a ground node of the power supply for the processors. In this way, the methods and apparatus may provide for independently disabling the processors by biasing gate terminal(s) of the respective switch transistor(s) below a voltage potential of the ground node.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1:
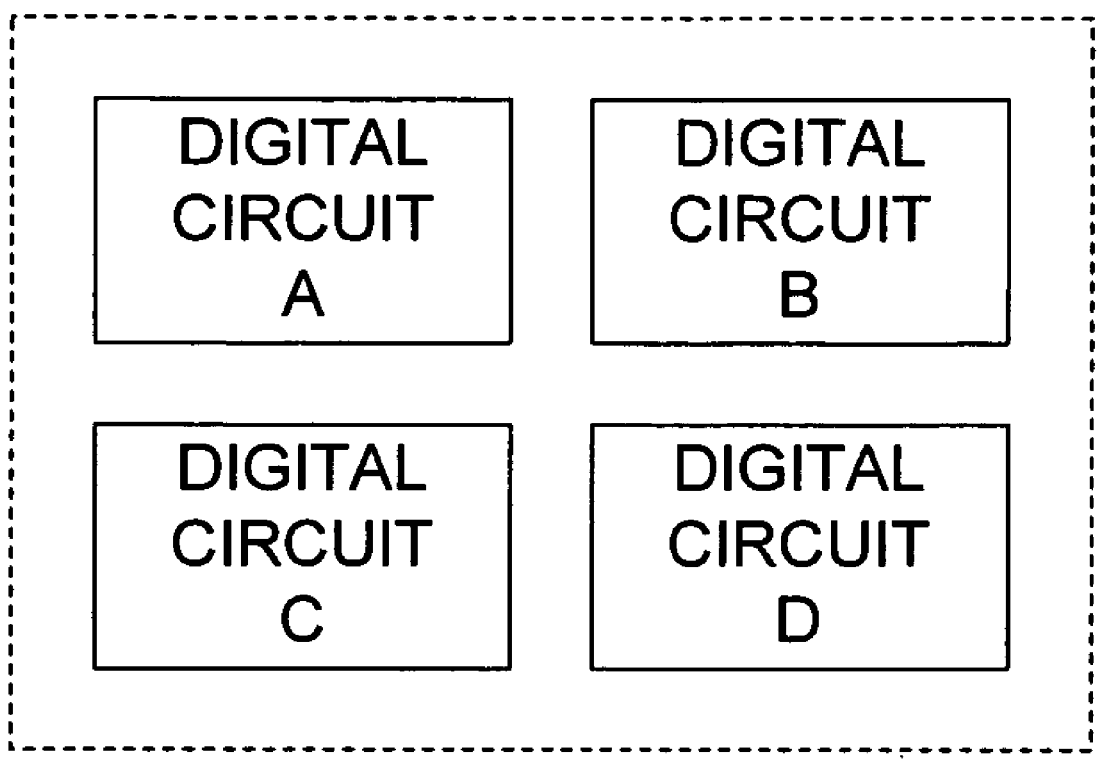
FIG. 1 is a block diagram illustrating the structure of a system employing redundant circuitry in accordance with the prior art.

With reference to the drawings, wherein like numerals indicate like elements, there is shown in FIG. 1 a processing system 100 that may be adapted for carrying out one or more features of the present invention. For the purposes of brevity and clarity, the block diagram of FIG. 1 will be referred to and described herein as illustrating an apparatus 100, it being understood, however, that the description may readily be applied to various aspects of a method with equal force.

The apparatus 100 preferably includes a plurality of processors 102A-H, although any number of processors may be employed without departing from the spirit and scope of the one or more embodiments of the invention. The processors 102 may be implemented utilizing any of the known technologies that are capable of requesting data from a system memory (not shown), and manipulating the data to achieve a desirable result. For example, the processors 102 may be implemented using any of the known microprocessors that are capable of executing software and/or firmware, including standard microprocessors, distributed microprocessors, etc. By way of example, the processors 102 may be a graphics processor that is capable of requesting and manipulating data, such as pixel data, including gray scale information, color information, texture data, polygonal information, video frame information, etc.

The processors 102 are preferably implemented on a silicon-on-insulator (SOI) integrated circuit. The processors 102 are powered by way of a power supply (not shown) that provides operating potential between terminals Vss and Vdd.

Usually, Vdd will be at ground potential (0V), although one or more embodiments of the present invention may provide for a negative potential for Vdd. In this regard, it is understood that the term "ground" is a name that may be associated with a node in the system to which reference will be made. Thus, "ground" may be 0V or may represent some other reference potential.

The system 100 also includes a plurality of switch transistors 105A-H and a control circuit 107. At least one switch transistor 105 is coupled from each of a plurality of virtual ground nodes 109A-H to the Vdd node. The control circuit 107 is operable to independently enable and/or disable the operation of the respective processors 102 by turning on and/or off the respective switch transistors 105. By way of example, the switch transistors may be implemented utilizing field effect transistor (FET) technology in which the transistor includes a gate G, a drain D, and a source S. The drain of the switch transistor 105 is preferably coupled to the virtual ground node 109 of the associated processor 102. The source of the switch transistor 105 is preferably coupled to the Vdd node.

The control circuit 107 is preferably coupled to the gate of the switch transistor 105 such that the voltage potential applied to the gate biases the switch transistor 105 on and/or off. When the control circuit 107 biases the associated switch transistor, such as switch transistor 105D in the on state, the voltage potential of the virtual ground node 109D is substantially equal to the voltage potential of the Vdd node. Thus, the power supply potential appears across the Vss-Vdd nodes and the processor 102D is capable of normal operation.

When one or more of the switch transistors 105 are implemented utilizing N-channel FET technology, the control circuit 107 is preferably operable to provide a positive potential on the gate of the switch transistor 105 with respect to the source in order to turn on the switch transistor 105 and enable the associated processor 102. Those skilled in the art will appreciate that other switch transistor technologies may require different biasing potentials to turn on the switch transistor 105 depending on the particular technology employed to implement such transistor.

When the control circuit 107 biases off the switch transistor, such as switch transistor 105D, the impedance of the switch transistor 105D increases significantly and the voltage potential of the virtual ground node 109D approaches the potential of the Vss node, which is normally substantially higher than the Vdd node. Thus, the processor 102D cannot draw current from the power supply through the Vss-Vdd nodes and the processor 102D is disabled.

When one or more of the switch transistors 105 are implemented utilizing N-channel FET technology, the control circuit 107 is preferably operable to provide a relatively low voltage potential on the gate of the switch transistor with reference to the source. Again, it is understood that other switch transistor technologies may require different biasing voltage parameters to turn off the switch transistor.

It is noted that the implementation of the control circuit 107 may be achieved in any number of ways, for example, via software executed on a suitable processor (such as a digital signal processor, microprocessor, etc.) or via a hardware approach, such as e-fuses.

As discussed above, some of the processors 102 may be faulty. The control circuit 107 is preferably operable to disable a faulty processor 102 by turning off the one or more switch transistors 105 associated therewith. Advantageously, a disabled processor 102 does not draw significant current from the power supply and, therefore, the power dissipation of the disabled processor 102 is significantly reduced as opposed to an enabled processor 102 or a disabled processor that could otherwise draw power from the power supply.

In a preferred embodiment, the control circuit 107 is manipulated during the manufacturing process (before or after package encapsulation) but before the product into which the multiprocessor 100 is disposed has completed assembly at the manufacturing facility. In this way, those ICs having faulty processors 102 may nevertheless be usable in products that do not require a full compliment of processors 102 to achieve performance goals.

Figure 3:
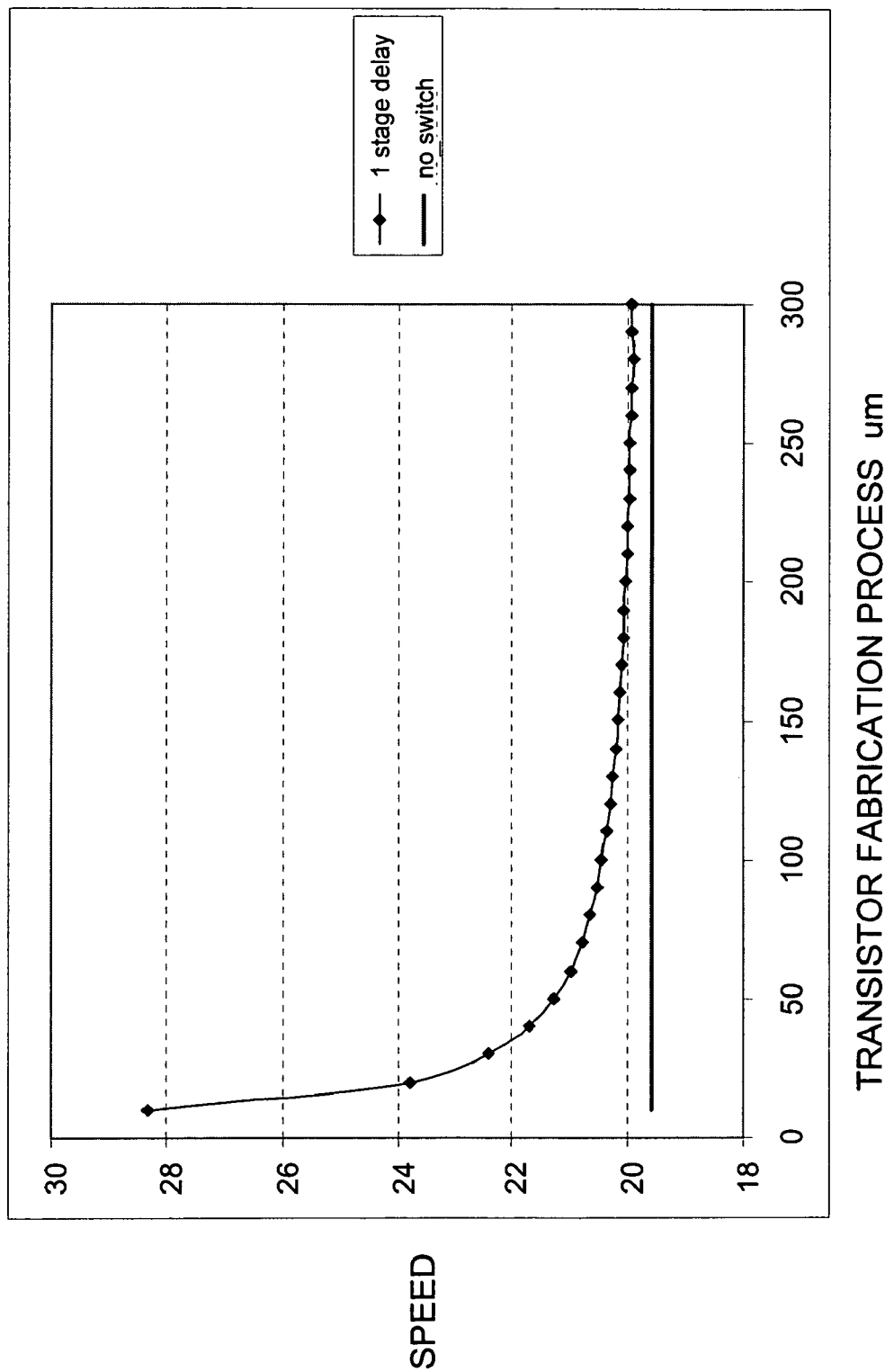
FIG. 3 is a graph illustrating the relationship between an evolving transistor fabrication process for a switch transistor and a resultant speed of a processing circuit switched thereby in accordance with one or more aspects of the present invention.
Figure 4:
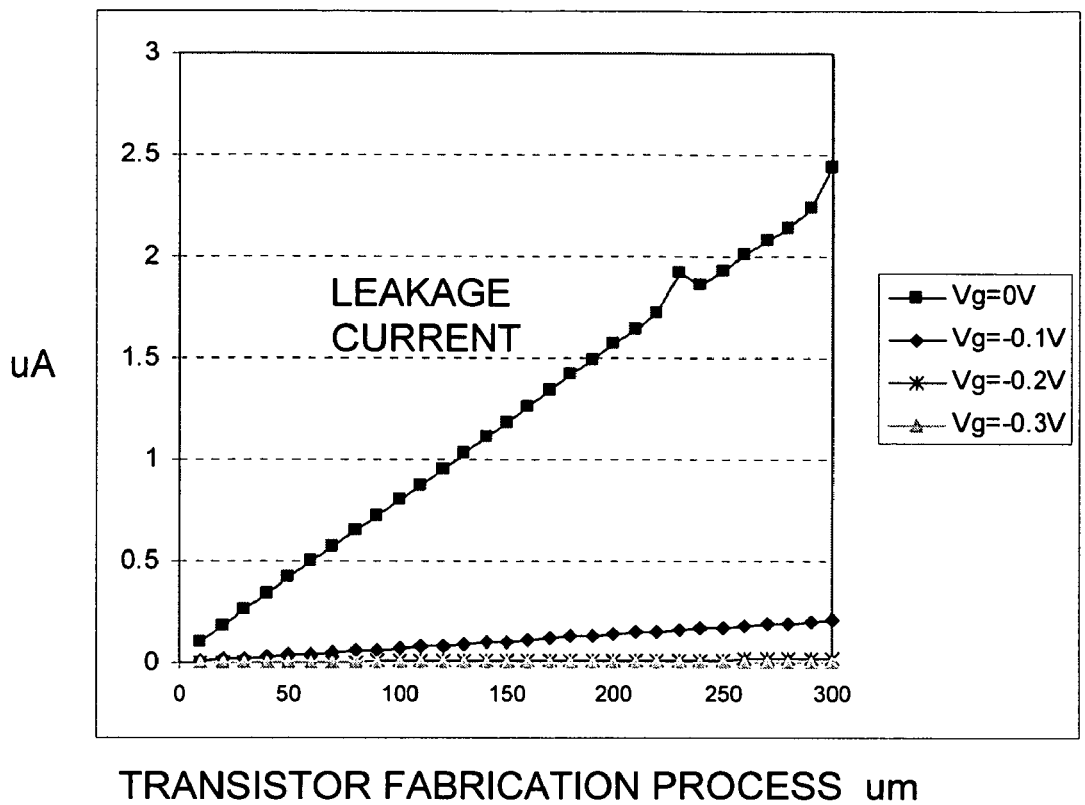
FIG. 4 is a graph illustrating the relationship between the leakage current of the switch transistor as a function of the evolving transistor fabrication process and the gate biasing voltage of the switch transistor in accordance with one or more aspects of the present invention.

Reference is now made to FIGS. 3-4, which are graphs illustrating certain relationships involving the operation of the processors 102 as a function of the switch transistors 105. In particular, FIG. 3 is graph illustrating the relationship between the fabrication process for the switch transistors 105 and a resultant processing speed of the processors 102. FIG. 4 is a graph illustrating the relationship between the leakage current of the switch transistors 105 as a function of the transistor fabrication process and the gate biasing voltage of the switch transistors 105. These graphs are provided to discuss certain non-ideal characteristics associated with disabling the processors 102 utilizing the switch transistors 105.

Figure 2:
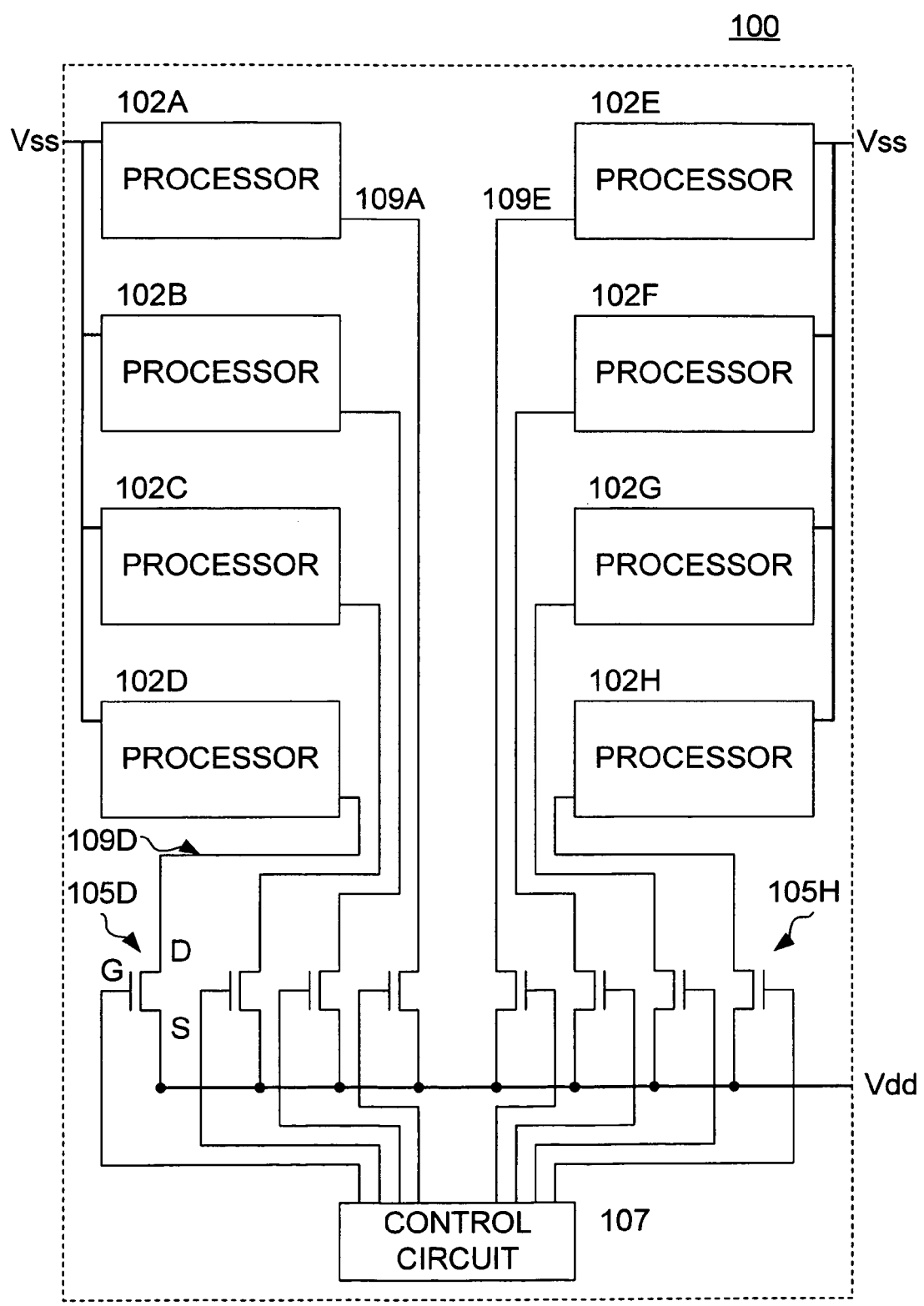
FIG. 2 is a block diagram illustrating a multi-processing system in accordance with one or more embodiments of the present invention.

As to FIG. 3, the ordinate axis represents an evolving transistor fabrication process in units of (um), where 90 um is the current fabrication process. The abscissa axis represents the speed at which an associated processor 102 may operate as a function of the transistor fabrication process employed to implement an associated switch transistor 105 (operating in the on state). As the fabrication process evolves, the speed at which an associated processor 102 may execute programs increases and, therefore, it is expected that utilizing a switch transistor 105 in the configuration illustrated in FIG. 2 should not significantly impact the speed of the associated processor 102.

With reference to FIG. 4, however, it is noted that the leakage current through the switch transistor 105 (during the off state) is not zero. Experiments have revealed that the leakage current is approximately 0.72 uA for a 90 um technology (or 10S process) and a bias voltage of 0V between gate and source (hereinafter Vg). This represents approximately 2% of the on current of the switch transistor, an undesirable component of power dissipation even when the associated processor 102 is disabled. As the fabrication process improves (moving the right along the ordinate axis) this percentage will increase significantly, thereby further increasing power dissipation.

From the combined relationships illustrated in FIGS. 3-4, it has been discovered that the use of a smaller transistor will reduce the leakage current; however, at the same time the performance speed will degrade. Thus, a design trade-off exists as between the leakage current and the speed performance.

Although the leakage current of a circuit implemented using a bulk process may be easily reduced by lowering the substrate voltage, control of the substrate voltage is not practical when an SOI process is employed to implement the multiprocessing system 100. Indeed, the SOI IC comprises segmented transistors. Although it is theoretically possible to provide a contact among the segmented transistors, and thus control the substrate voltage, the contact resistance would be very high (in the range of MOhms).

It has been discovered, however, that desirable effects as concerns the leakage current are achieved when Vg is reduced below 0V, such as −0.1V, −0.2V, −0.3V, etc. Preferably, the control circuit is operable to bias Vg to between about −0.05V and about −0.3V, between about −0.1V and about −0.4V, between about −0.2V and about −0.5V, and/or to at least about 0.1V below the voltage potential of the Vdd node (assuming the switch transistors 105 are referenced to such node). As best seen in FIG. 4, the leakage current drops from 0.72 uA to about 0.01 uA when Vg=−0.2V (using the 10S process environment). Even further reductions in leakage current may be obtained as Vg is reduced.

Figure 5:
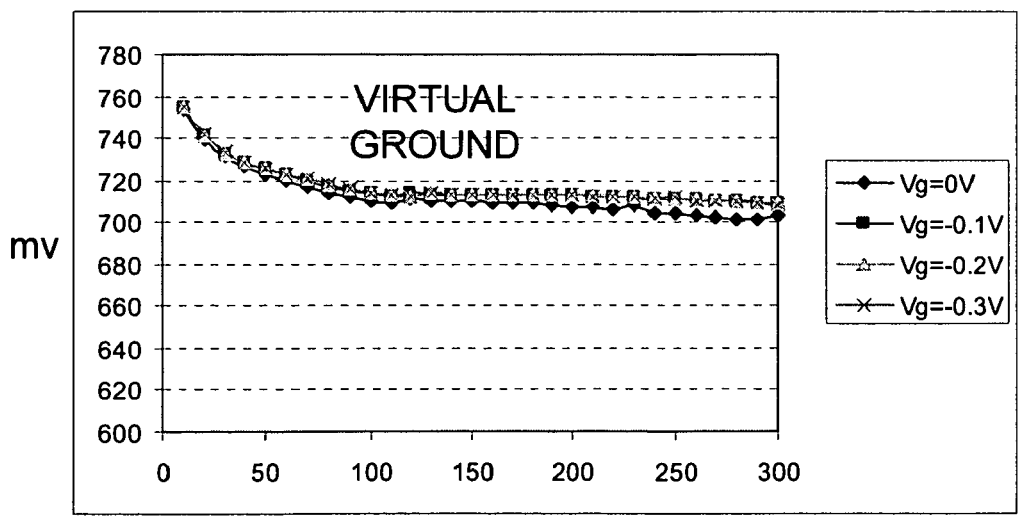
FIG. 5 is a graph illustrating the relationship between the potential of the virtual ground controlled by the switch transistor as a function of the evolving transistor fabrication process and the gate biasing voltage of the switch transistor in accordance with one or more aspects of the present invention.

FIG. 5 is a graph illustrating the relationship between the potential of the virtual ground nodes 109 controlled by the switch transistors 105 as a function of the evolving transistor fabrication process and Vg. As may be seen in the graph, the potential of the virtual ground node 109 is approximately 0.71 V with respect to the Vdd node at fabrication processes above 90 um. Although the potential of the virtual ground node 109 increases slightly with −Vg, such increase is negligible.

Figure 6:
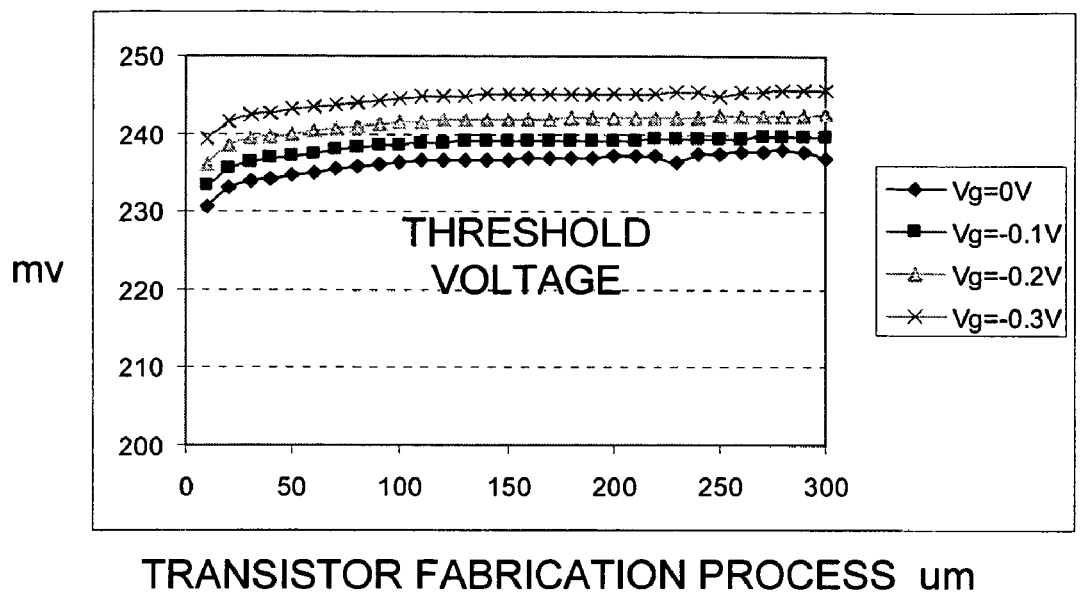
FIG. 6 is a graph illustrating the relationship between the threshold voltage of the switch transistor as a function of the evolving transistor fabrication process and the gate biasing voltage of the switch transistor in accordance with one or more aspects of the present invention.

FIG. 6 is a graph illustrating the relationship between the threshold voltage of the switch transistors 105 as a function of the evolving transistor fabrication process and Vg. The graph reveals that the threshold voltage Vt of the switch transistors 105 increases as the negative magnitude of Vg increases. This is consistent with the affect that Vg has on the leakage current (FIG. 4) because the leakage current of the switch transistor 105 in the off state reduces as the threshold voltage Vt increases.

Figure 7:
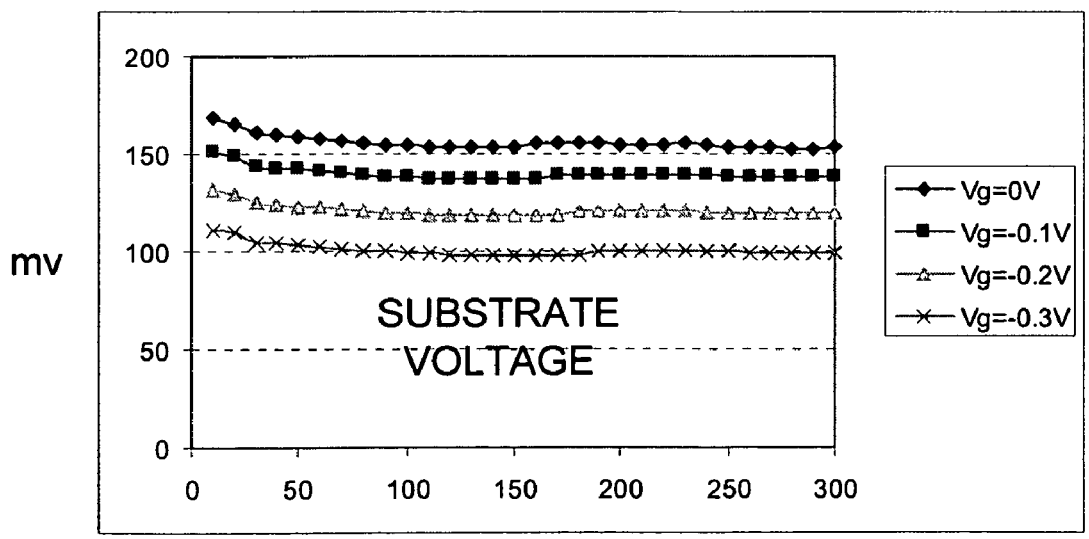
FIG. 7 is a graph illustrating the relationship between the body voltage of the switch transistor as a function of the evolving transistor fabrication process and the gate biasing voltage of the switch transistor in accordance with one or more aspects of the present invention.

FIG. 7 is a graph illustrating the relationship between the body voltage (or substrate voltage) of the switch transistors 105 as a function of the transistor fabrication process and Vg. As shown, the voltage of the substrate decreases as the negative magnitude of Vg increases.

FIGS. 4-7 reveal that the control circuit 107 is operable to vary the leakage current, virtual ground potential, threshold voltage, and/or substrate voltage as a function of Vg.

Figure 8:
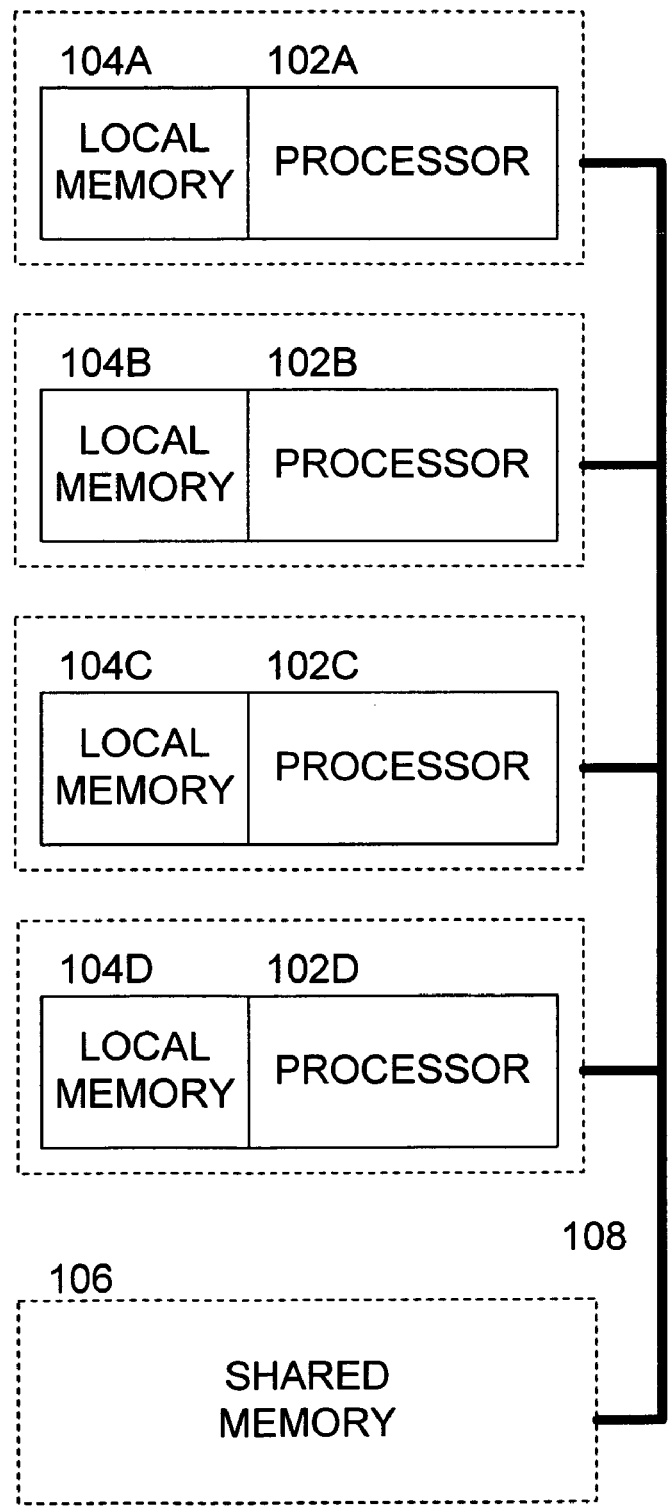
FIG. 8 is a diagram illustrating a multiprocessing system that may be adapted using the switch transistors and control as in FIG. 2 to implement one or more further aspects of the present invention.

FIG. 8 is a block diagram of a multi-processing system 100A that may be adapted to implement the features discussed herein and one or more further embodiments of the present invention. The system 100A includes a plurality of processors 102A-D, associated local memories 104A-D, and a shared memory 106 interconnected by way of a bus 108. The shared memory 106 may also be referred to herein as a main memory or system memory. Although four processors 102 are illustrated by way of example, any number may be utilized without departing from the spirit and scope of the present invention. Each of the processors 102 may be of similar construction or of differing construction.

Although not shown, the switch transistors and control circuit illustrated and discussed hereinabove with respect to FIGS. 2-7 are preferably employed to achieve enable/disable functionality.

The local memories 104 are preferably located on the same chip (same semiconductor substrate) as their respective processors 102; however, the local memories 104 are preferably not traditional hardware cache memories in that there are no on-chip or off-chip hardware cache circuits, cache registers, cache memory controllers, etc. to implement a hardware cache memory function.

The processors 102 preferably provide data access requests to copy data (which may include program data) from the system memory 106 over the bus 108 into their respective local memories 104 for program execution and data manipulation. The mechanism for facilitating data access is preferably implemented utilizing a direct memory access controller (DMAC), not shown. The DMAC of each processor is preferably of substantially the same capabilities as discussed hereinabove with respect to other features of the invention.

The system memory 106 is preferably a dynamic random access memory (DRAM) coupled to the processors 102 through a high bandwidth memory connection (not shown). Although the system memory 106 is preferably a DRAM, the memory 106 may be implemented using other means, e.g., a static random access memory (SRAM), a magnetic random access memory (MRAM), an optical memory, a holographic memory, etc.

Each processor 102 is preferably implemented using a processing pipeline, in which logic instructions are processed in a pipelined fashion. Although the pipeline may be divided into any number of stages at which instructions are processed, the pipeline generally comprises fetching one or more instructions, decoding the instructions, checking for dependencies among the instructions, issuing the instructions, and executing the instructions. In this regard, the processors 102 may include an instruction buffer, instruction decode circuitry, dependency check circuitry, instruction issue circuitry, and execution stages.

In one or more embodiments, the processors 102 and the local memories 104 may be disposed on a common semiconductor substrate. In one or more further embodiments, the shared memory 106 may also be disposed on the common semiconductor substrate or it may be separately disposed.

In one or more alternative embodiments, one or more of the processors 102 may operate as a main processor operatively coupled to the other processors 102 and capable of being coupled to the shared memory 106 over the bus 108. The main processor may schedule and orchestrate the processing of data by the other processors 102. Unlike the other processors 102, however, the main processor may be coupled to a hardware cache memory, which is operable cache data obtained from at least one of the shared memory 106 and one or more of the local memories 104 of the processors 102. The main processor may provide data access requests to copy data (which may include program data) from the system memory 106 over the bus 108 into the cache memory for program execution and data manipulation utilizing any of the known techniques, such as DMA techniques.

A description of a preferred computer architecture for a multi-processor system will now be provided that is suitable for carrying out one or more of the features discussed herein. In accordance with one or more embodiments, the multi-processor system may be implemented as a single-chip solution operable for stand-alone and/or distributed processing of media-rich applications, such as game systems, home terminals, PC systems, server systems and workstations. In some applications, such as game systems and home terminals, real-time computing may be a necessity. For example, in a real-time, distributed gaming application, one or more of networking image decompression, 3D computer graphics, audio generation, network communications, physical simulation, and artificial intelligence processes have to be executed quickly enough to provide the user with the illusion of a real-time experience. Thus, each processor in the multi-processor system must complete tasks in a short and predictable time.

To this end, and in accordance with this computer architecture, all processors of a multi-processing computer system are constructed from a common computing module (or cell). This common computing module has a consistent structure and preferably employs the same instruction set architecture. The multi-processing computer system can be formed of one or more clients, servers, PCs, mobile computers, game machines, PDAs, set top boxes, appliances, digital televisions and other devices using computer processors.

A plurality of the computer systems may also be members of a network if desired. The consistent modular structure enables efficient, high speed processing of applications and data by the multi-processing computer system, and if a network is employed, the rapid transmission of applications and data over the network. This structure also simplifies the building of members of the network of various sizes and processing power and the preparation of applications for processing by these members.

Figure 9:
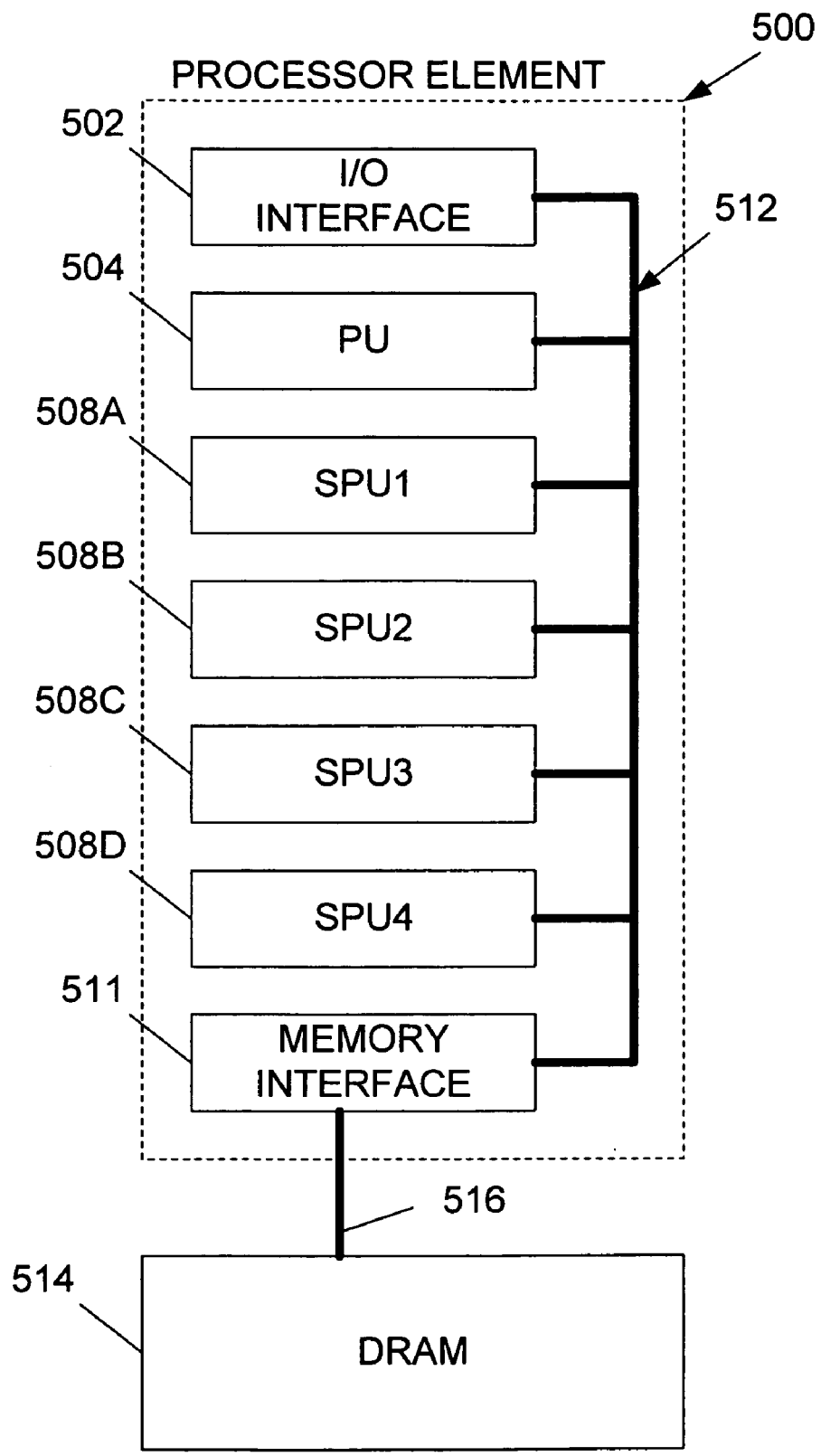
FIG. 9 is a diagram illustrating a preferred processor element (PE) that may be used to implement one or more further aspects of the present invention.

With reference to FIG. 9, the basic processing module is a processor element (PE) 500. The PE 500 comprises an I/O interface 502, a processing unit (PU) 504, and a plurality of sub-processing units 508, namely, sub-processing unit 508A, sub-processing unit 508B, sub-processing unit 508C, and sub-processing unit 508D. A local (or internal) PE bus 512 transmits data and applications among the PU 504, the sub-processing units 508, and a memory interface 511. The local PE bus 512 can have, e.g., a conventional architecture or can be implemented as a packet-switched network. If implemented as a packet switch network, while requiring more hardware, increases the available bandwidth.

The PE 500 can be constructed using various methods for implementing digital logic. The PE 500 preferably is constructed, however, as a single integrated circuit employing a complementary metal oxide semiconductor (CMOS) on a silicon substrate. Alternative materials for substrates include gallium arsinide, gallium aluminum arsinide and other so-called III-B compounds employing a wide variety of dopants. The PE 500 also may be implemented using superconducting material, e.g., rapid single-flux-quantum (RSFQ) logic.

The PE 500 is closely associated with a shared (main) memory 514 through a high bandwidth memory connection 516. Although the memory 514 preferably is a dynamic random access memory (DRAM), the memory 514 could be implemented using other means, e.g., as a static random access memory (SRAM), a magnetic random access memory (MRAM), an optical memory, a holographic memory, etc.

The PU 504 and the sub-processing units 508 are preferably each coupled to a memory flow controller (MFC) including direct memory access DMA functionality, which in combination with the memory interface 511, facilitate the transfer of data between the DRAM 514 and the sub-processing units 508 and the PU 504 of the PE 500. It is noted that the DMAC and/or the memory interface 511 may be integrally or separately disposed with respect to the sub-processing units 508 and the PU 504. Indeed, the DMAC function and/or the memory interface 511 function may be integral with one or more (preferably all) of the sub-processing units 508 and the PU 504. It is also noted that the DRAM 514 may be integrally or separately disposed with respect to the PE 500. For example, the DRAM 514 may be disposed off-chip as is implied by the illustration shown or the DRAM 514 may be disposed on-chip in an integrated fashion.

The PU 504 can be, e.g., a standard processor capable of stand-alone processing of data and applications. In operation, the PU 504 preferably schedules and orchestrates the processing of data and applications by the sub-processing units. The sub-processing units preferably are single instruction, multiple data (SIMD) processors. Under the control of the PU 504, the sub-processing units perform the processing of these data and applications in a parallel and independent manner. The PU 504 is preferably implemented using a PowerPC core, which is a microprocessor architecture that employs reduced instruction-set computing (RISC) technique. RISC performs more complex instructions using combinations of simple instructions. Thus, the timing for the processor may be based on simpler and faster operations, enabling the microprocessor to perform more instructions for a given clock speed.

It is noted that the PU 504 may be implemented by one of the sub-processing units 508 taking on the role of a main processing unit that schedules and orchestrates the processing of data and applications by the sub-processing units 508. Further, there may be more than one PU implemented within the processor element 500.

In accordance with this modular structure, the number of PEs 500 employed by a particular computer system is based upon the processing power required by that system. For example, a server may employ four PEs 500, a workstation may employ two PEs 500 and a PDA may employ one PE 500. The number of sub-processing units of a PE 500 assigned to processing a particular software cell depends upon the complexity and magnitude of the programs and data within the cell.

Figure 10:
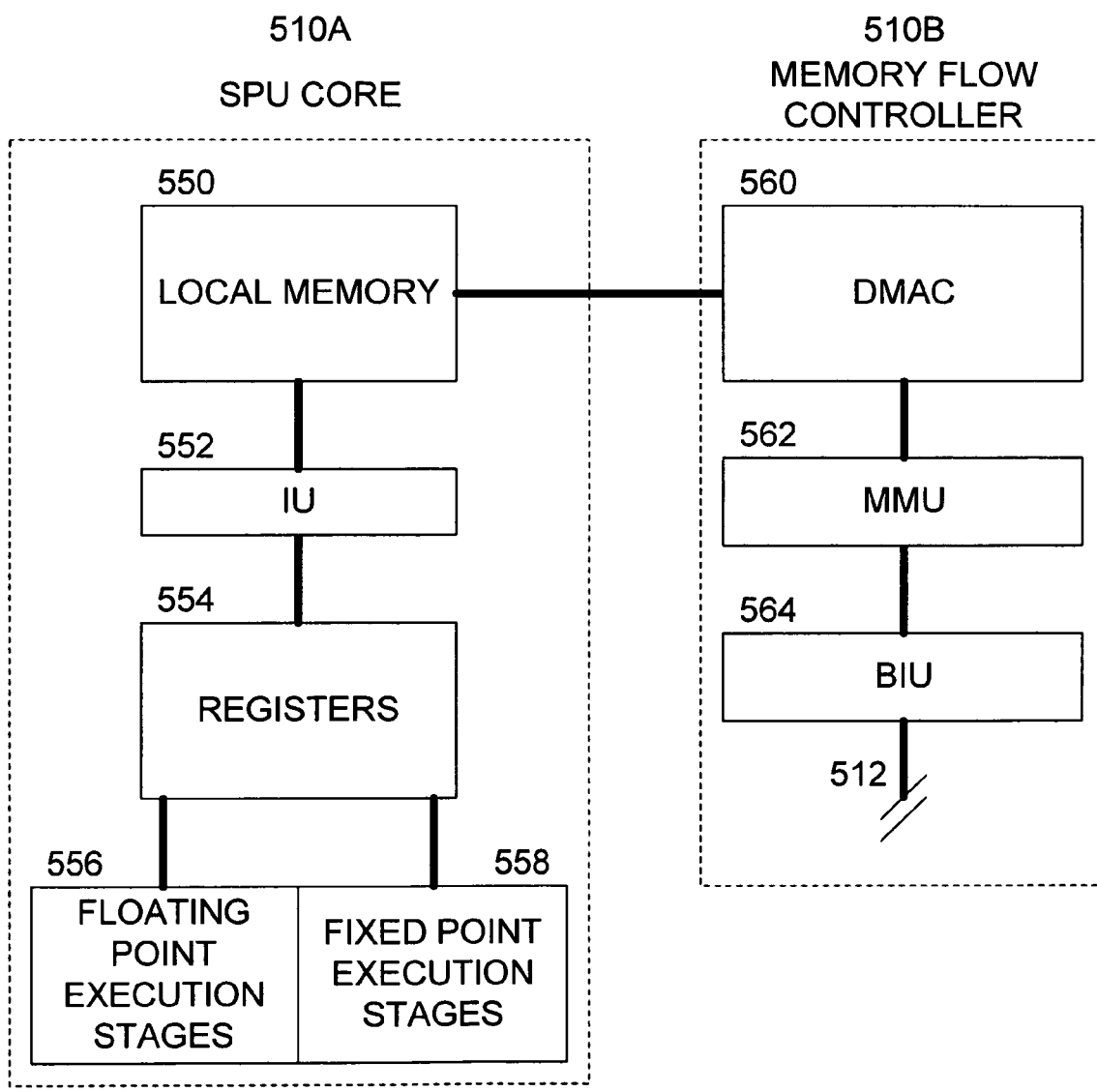
FIG. 10 is a diagram illustrating the structure of an exemplary sub-processing unit (SPU) of the system of FIG. 9 that may be adapted in accordance with one or more further aspects of the present invention.
Figure 11:
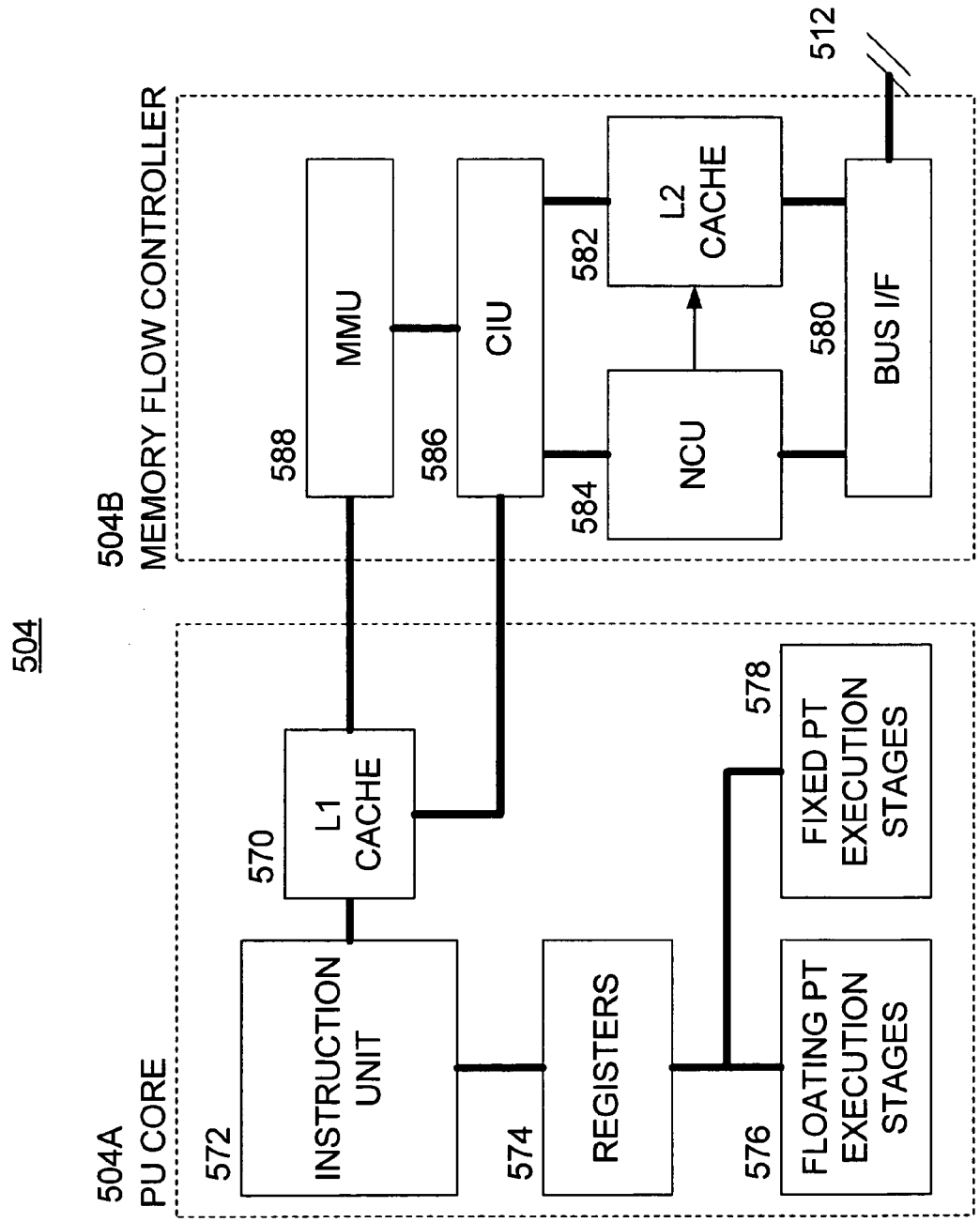
FIG. 11 is a diagram illustrating the structure of an exemplary processing unit (PU) of the system of FIG. 9 that may be adapted in accordance with one or more further aspects of the present invention.

FIG. 10 illustrates the preferred structure and function of a sub-processing unit (SPU) 508. The SPU 508 architecture preferably fills a void between general-purpose processors (which are designed to achieve high average performance on a broad set of applications) and special-purpose processors (which are designed to achieve high performance on a single application). The SPU 508 is designed to achieve high performance on game applications, media applications, broadband systems, etc., and to provide a high degree of control to programmers of real-time applications. Some capabilities of the SPU 508 include graphics geometry pipelines, surface subdivision, Fast Fourier Transforms, image processing keywords, stream processing, MPEG encoding/decoding, encryption, decryption, device driver extensions, modeling, game physics, content creation, and audio synthesis and processing.

The sub-processing unit 508 includes two basic functional units, namely an SPU core 510A and a memory flow controller (MFC) 510B. The SPU core 510A performs program execution, data manipulation, etc., while the MFC 510B performs functions related to data transfers between the SPU core 510A and the DRAM 514 of the system.

The SPU core 510A includes a local memory 550, an instruction unit (IU) 552, registers 554, one ore more floating point execution stages 556 and one or more fixed point execution stages 558. The local memory 550 is preferably implemented using single-ported random access memory, such as an SRAM. Whereas most processors reduce latency to memory by employing caches, the SPU core 510A implements the relatively small local memory 550 rather than a cache. Indeed, in order to provide consistent and predictable memory access latency for programmers of real-time applications (and other applications as mentioned herein) a cache memory architecture within the SPU 508A is not preferred. The cache hit/miss characteristics of a cache memory results in volatile memory access times, varying from a few cycles to a few hundred cycles. Such volatility undercuts the access timing predictability that is desirable in, for example, real-time application programming. Latency hiding may be achieved in the local memory SRAM 550 by overlapping DMA transfers with data computation. This provides a high degree of control for the programming of real-time applications. As the latency and instruction overhead associated with DMA transfers exceeds that of the latency of servicing a cache miss, the SRAM local memory approach achieves an advantage when the DMA transfer size is sufficiently large and is sufficiently predictable (e.g., a DMA command can be issued before data is needed).

A program running on a given one of the sub-processing units 508 references the associated local memory 550 using a local address, however, each location of the local memory 550 is also assigned a real address (RA) within the overall system's memory map. This allows Privilege Software to map a local memory 550 into the Effective Address (EA) of a process to facilitate DMA transfers between one local memory 550 and another local memory 550. The PU 504 can also directly access the local memory 550 using an effective address. In a preferred embodiment, the local memory 550 contains 556 kilobytes of storage, and the capacity of registers 552 is 128×128 bits.

The SPU core 504A is preferably implemented using a processing pipeline, in which logic instructions are processed in a pipelined fashion. Although the pipeline may be divided into any number of stages at which instructions are processed, the pipeline generally comprises fetching one or more instructions, decoding the instructions, checking for dependencies among the instructions, issuing the instructions, and executing the instructions. In this regard, the IU 552 includes an instruction buffer, instruction decode circuitry, dependency check circuitry, and instruction issue circuitry.

The instruction buffer preferably includes a plurality of registers that are coupled to the local memory 550 and operable to temporarily store instructions as they are fetched. The instruction buffer preferably operates such that all the instructions leave the registers as a group, i.e., substantially simultaneously. Although the instruction buffer may be of any size, it is preferred that it is of a size not larger than about two or three registers.

In general, the decode circuitry breaks down the instructions and generates logical micro-operations that perform the function of the corresponding instruction. For example, the logical micro-operations may specify arithmetic and logical operations, load and store operations to the local memory 550, register source operands and/or immediate data operands. The decode circuitry may also indicate which resources the instruction uses, such as target register addresses, structural resources, function units and/or busses. The decode circuitry may also supply information indicating the instruction pipeline stages in which the resources are required. The instruction decode circuitry is preferably operable to substantially simultaneously decode a number of instructions equal to the number of registers of the instruction buffer.

The dependency check circuitry includes digital logic that performs testing to determine whether the operands of given instruction are dependent on the operands of other instructions in the pipeline. If so, then the given instruction should not be executed until such other operands are updated (e.g., by permitting the other instructions to complete execution). It is preferred that the dependency check circuitry determines dependencies of multiple instructions dispatched from the decoder circuitry 112 simultaneously.

The instruction issue circuitry is operable to issue the instructions to the floating point execution stages 556 and/or the fixed point execution stages 558.

The registers 554 are preferably implemented as a relatively large unified register file, such as a 128-entry register file. This allows for deeply pipelined high-frequency implementations without requiring register renaming to avoid register starvation. Renaming hardware typically consumes a significant fraction of the area and power in a processing system. Consequently, advantageous operation may be achieved when latencies are covered by software loop unrolling or other interleaving techniques.

Preferably, the SPU core 510A is of a superscalar architecture, such that more than one instruction is issued per clock cycle. The SPU core 510A preferably operates as a superscalar to a degree corresponding to the number of simultaneous instruction dispatches from the instruction buffer, such as between 2 and 3 (meaning that two or three instructions are issued each clock cycle). Depending upon the required processing power, a greater or lesser number of floating point execution stages 556 and fixed point execution stages 558 may be employed. In a preferred embodiment, the floating point execution stages 556 operate at a speed of 32 billion floating point operations per second (32 GFLOPS), and the fixed point execution stages 558 operate at a speed of 32 billion operations per second (32 GOPS).

The MFC 510B preferably includes a bus interface unit (BIU) 564, a memory management unit (MMU) 562, and a direct memory access controller (DMAC) 560. With the exception of the DMAC 560, the MFC 510B preferably runs at half frequency (half speed) as compared with the SPU core 510A and the bus 512 to meet low power dissipation design objectives. The MFC 510B is operable to handle data and instructions coming into the SPU 508 from the bus 512, provides address translation for the DMAC, and snoop-operations for data coherency. The BIU 564 provides an interface between the bus 512 and the MMU 562 and DMAC 560. Thus, the SPU 508 (including the SPU core 510A and the MFC 510B) and the DMAC 560 are connected physically and/or logically to the bus 512.

The MMU 562 is preferably operable to translate effective addresses (taken from DMA commands) into real addresses for memory access. For example, the MMU 562 may translate the higher order bits of the effective address into real address bits. The lower-order address bits, however, are preferably untranslatable and are considered both logical and physical for use to form the real address and request access to memory. In one or more embodiments, the MMU 562 may be implemented based on a 64-bit memory management model, and may provide $2^{64}$ bytes of effective address space with 4K-, 64K-, 1M-, and 16M-byte page sizes and 256 MB segment sizes. Preferably, the MMU 562 is operable to support up to $2^{65}$ bytes of virtual memory, and $2^{42}$ bytes (4 TeraBytes) of physical memory for DMA commands. The hardware of the MMU 562 may include an 8-entry, fully associative SLB, a 256-entry, 4way set associative TLB, and a 4×4 Replacement Management Table (RMT) for the TLB—used for hardware TLB miss handling.

The DMAC 560 is preferably operable to manage DMA commands from the SPU core 510A and one or more other devices such as the PU 504 and/or the other SPUs. There may be three categories of DMA commands: Put commands, which operate to move data from the local memory 550 to the shared memory 514; Get commands, which operate to move data into the local memory 550 from the shared memory 514; and Storage Control commands, which include SLI commands and synchronization commands. The synchronization commands may include atomic commands, send signal commands, and dedicated barrier commands. In response to DMA commands, the MMU 562 translates the effective address into a real address and the real address is forwarded to the BIU 564.

The SPU core 510A preferably uses a channel interface and data interface to communicate (send DMA commands, status, etc.) with an interface within the DMAC 560. The SPU core 510A dispatches DMA commands through the channel interface to a DMA queue in the DMAC 560. Once a DMA command is in the DMA queue, it is handled by issue and completion logic within the DMAC 560. When all bus transactions for a DMA command are finished, a completion signal is sent back to the SPU core 510A over the channel interface.

FIG. 10 illustrates the preferred structure and function of the PU 504. The PU 504 includes two basic functional units, the PU core 504A and the memory flow controller (MFC) 504B. The PU core 504A performs program execution, data manipulation, multi-processor management functions, etc., while the MFC 504B performs functions related to data transfers between the PU core 504A and the memory space of the system 100.

The PU core 504A may include an L1 cache 570, an instruction unit 572, registers 574, one or more floating point execution stages 576 and one or more fixed point execution stages 578. The L1 cache provides data caching functionality for data received from the shared memory 106, the processors 102, or other portions of the memory space through the MFC 504B. As the PU core 504A is preferably implemented as a superpipeline, the instruction unit 572 is preferably implemented as an instruction pipeline with many stages, including fetching, decoding, dependency checking, issuing, etc. The PU core 504A is also preferably of a superscalar configuration, whereby more than one instruction is issued from the instruction unit 572 per clock cycle. To achieve a high processing power, the floating point execution stages 576 and the fixed point execution stages 578 include a plurality of stages in a pipeline configuration. Depending upon the required processing power, a greater or lesser number of floating point execution stages 576 and fixed point execution stages 578 may be employed.

The MFC 504B includes a bus interface unit (BIU) 580, an L2 cache memory, a non-cachable unit (NCU) 584, a core interface unit (CIU) 586, and a memory management unit (MMU) 588. Most of the MFC 504B runs at half frequency (half speed) as compared with the PU core 504A and the bus 108 to meet low power dissipation design objectives.

The BIU 580 provides an interface between the bus 108 and the L2 cache 582 and NCU 584 logic blocks. To this end, the BIU 580 may act as a Master as well as a Slave device on the bus 108 in order to perform fully coherent memory operations. As a Master device it may source load/store requests to the bus 108 for service on behalf of the L2 cache 582 and the NCU 584. The BIU 580 may also implement a flow control mechanism for commands which limits the total number of commands that can be sent to the bus 108. The data operations on the bus 108 may be designed to take eight beats and, therefore, the BIU 580 is preferably designed around 128 byte cache-lines and the coherency and synchronization granularity is 128 KB.

The L2 cache memory 582 (and supporting hardware logic) is preferably designed to cache 512 KB of data. For example, the L2 cache 582 may handle cacheable loads/stores, data pre-fetches, instruction fetches, instruction pre-fetches, cache operations, and barrier operations. The L2 cache 582 is preferably an 8-way set associative system. The L2 cache 582 may include six reload queues matching six (6) castout queues (e.g., six RC machines), and eight (64-byte wide) store queues. The L2 cache 582 may operate to provide a backup copy of some or all of the data in the L1 cache 570. Advantageously, this is useful in restoring state(s) when processing nodes are hot-swapped. This configuration also permits the L1 cache 570 to operate more quickly with fewer ports, and permits faster cache-to-cache transfers (because the requests may stop at the L2 cache 582). This configuration also provides a mechanism for passing cache coherency management to the L2 cache memory 582.

The NCU 584 interfaces with the CIU 586, the L2 cache memory 582, and the BIU 580 and generally functions as a queueing/buffering circuit for non-cacheable operations between the PU core 504A and the memory system. The NCU 584 preferably handles all communications with the PU core 504A that are not handled by the L2 cache 582, such as cache-inhibited load/stores, barrier operations, and cache coherency operations. The NCU 584 is preferably run at half speed to meet the aforementioned power dissipation objectives.

The CIU 586 is disposed on the boundary of the MFC 504B and the PU core 504A and acts as a routing, arbitration, and flow control point for requests coming from the execution stages 576, 578, the instruction unit 572, and the MMU unit 588 and going to the L2 cache 582 and the NCU 584. The PU core 504A and the MMU 588 preferably run at full speed, while the L2 cache 582 and the NCU 584 are operable for a 2:1 speed ratio. Thus, a frequency boundary exists in the CIU 586 and one of its functions is to properly handle the frequency crossing as it forwards requests and reloads data between the two frequency domains.

The CIU 586 is comprised of three functional blocks: a load unit, a store unit, and reload unit. In addition, a data pre-fetch function is performed by the CIU 586 and is preferably a functional part of the load unit. The CIU 586 is preferably operable to: (i) accept load and store requests from the PU core 504A and the MMU 588; (ii) convert the requests from full speed clock frequency to half speed (a 2:1 clock frequency conversion); (iii) route cachable requests to the L2 cache 582, and route non-cachable requests to the NCU 584; (iv) arbitrate fairly between the requests to the L2 cache 582 and the NCU 584; (v) provide flow control over the dispatch to the L2 cache 582 and the NCU 584 so that the requests are received in a target window and overflow is avoided; (vi) accept load return data and route it to the execution stages 576, 578, the instruction unit 572, or the MMU 588; (vii) pass snoop requests to the execution stages 576, 578, the instruction unit 572, or the MMU 588; and (viii) convert load return data and snoop traffic from half speed to full speed.

The MMU 588 preferably provides address translation for the PU core 540A, such as by way of a second level address translation facility. A first level of translation is preferably provided in the PU core 504A by separate instruction and data ERAT (effective to real address translation) arrays that may be much smaller and faster than the MMU 588.

In a preferred embodiment, the PU 504 operates at 4-6 GHz, 10F04, with a 64-bit implementation. The registers are preferably 64 bits long (although one or more special purpose registers may be smaller) and effective addresses are 64 bits long. The instruction unit 570, registers 572 and execution stages 574 and 576 are preferably implemented using PowerPC technology to achieve the (RISC) computing technique.

Additional details regarding the modular structure of this computer system may be found in U.S. Pat. No. 6,526,491, the entire disclosure of which is hereby incorporated by reference.

In accordance with at least one further aspect of the present invention, the methods and apparatus described above may be achieved utilizing suitable hardware, such as that illustrated in the figures. Such hardware may be implemented utilizing any of the known technologies, such as standard digital circuitry, any of the known processors that are operable to execute software and/or firmware programs, one or more programmable digital devices or systems, such as programmable read only memories (PROMs), programmable array logic devices (PALs), etc. Furthermore, although the apparatus illustrated in the figures are shown as being partitioned into certain functional blocks, such blocks may be implemented by way of separate circuitry and/or combined into one or more functional units. Still further, the various aspects of the invention may be implemented by way of software and/or firmware program(s) that may be stored on suitable storage medium or media (such as floppy disk(s), memory chip(s), etc.) for transportability and/or distribution.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
   at least one digital circuit implemented using a plurality of transistors in a silicon-on-insulator (SOI) arrangement, at least some of the transistors being referenced to a virtual ground node;
   at least one switch transistor coupled from the virtual ground node to a ground node for a power supply to the digital circuit; and
   a control circuit operable to: (i) enable the digital circuit by biasing the switch transistor ON such that a voltage potential of the virtual ground node is substantially equal to a voltage potential of the ground node; (ii) disable the digital circuit by biasing a gate terminal of the switch transistor below the voltage potential of the ground node such that the voltage potential of the virtual ground is substantially higher than the ground node; and (iii) control a substrate voltage of the SOI arrangement as a function of a threshold voltage of the at least one switch transistor.

2. The apparatus of claim 1, wherein the control circuit is further operable to bias the gate of the switch transistor to between about −0.05 V and about −0.3 V with respect to the ground node to disable the digital circuit.

3. The apparatus of claim 1, wherein the control circuit is further operable to bias the gate of the switch transistor to between about −0.1 V and about −0.4 V with respect to the ground node to disable the digital circuit.

4. The apparatus of claim 1, wherein the control circuit is further operable to bias the gate of the switch transistor to between about −0.2 V and about −0.5 V with respect to the ground node to disable the digital circuit.

5. The apparatus of claim 1, wherein the control circuit is further operable to bias the gate of the switch transistor to at least about 0.1 V below a voltage potential of the ground node to disable the digital circuit.

6. The apparatus of claim 1, wherein the control circuit is further operable to control a leakage current of the switch transistor as a function of a biasing voltage potential applied to the gate of the switch transistor.

7. The apparatus of claim 1, further comprising:
   a plurality of such digital circuits, each digital circuit having a respective virtual ground node; and
   at least one such switch transistor coupled from each of the virtual ground nodes to the ground node,
   wherein the control circuit is further operable to independently disable the digital circuits by biasing the gate terminal(s) of the associated switch transistor(s) below the voltage potential of the ground node.

8. An apparatus, comprising:
   a plurality of processors, each processor: (i) being capable of operative communication with a main memory, (ii) being implemented using a plurality of transistors in a silicon-on-insulator (SOI) arrangement, and (iii) having at least some of its transistors referenced to a respective virtual ground node;
   at least one switch transistor coupled from each of the virtual ground nodes to a ground node of a power supply for the processors; and
   a control circuit operable to: (i) independently disable the processors by biasing gate terminal(s) of the respective switch transistor(s) below a voltage potential of the ground node; and (ii) control a substrate voltage of the SOI arrangement as a function of a threshold voltage of the at least one switch transistor.

9. The apparatus of claim 8, wherein the control circuit is further operable to bias the gate of the switch transistor to at least about 0.1 V below a voltage potential of the ground node to disable the digital circuit.

10. The apparatus of claim 8, wherein the control circuit is further operable to control leakage currents of the switch transistors as a function of a biasing voltage potential applied to the gate terminals of the switch transistors.

11. The apparatus of claim 8, wherein at least one of:
    each of the processors includes a local memory that is not a hardware cache memory;
    the processors and associated local memories are disposed in a common SOI arrangement; and
    the processors, associated local memories, and the main memory are disposed in a common SOI arrangement.

12. A method, comprising:
    enabling a digital circuit by biasing at least one switch transistor ON such that a voltage potential of a virtual ground node is substantially equal to a voltage potential of a ground node for a power supply to the digital circuit, wherein the digital circuit is implemented using a plurality of transistors in a silicon-on-insulator (SOI) arrangement and at least some of the transistors are referenced to the virtual ground node;
    disabling the digital circuit by biasing a gate terminal of the switch transistor below the voltage potential of the ground node; and
    controlling a substrate voltage of the SOI arrangement as a function of a threshold voltage of the at least one switch transistor.

13. The method of claim 12, wherein one of:
    the step of disabling includes biasing the gate of the switch transistor to between about −0.05 V and about −0.3 V with respect to the ground node;
    the step of disabling includes biasing the gate of the switch transistor to between about −0.1 V and about −0.4 V with respect to the ground node;
    the step of disabling includes biasing the gate of the switch transistor to between about −0.2 V and about −0.5 V with respect to the ground node; and
    the step of disabling includes biasing the gate of the switch transistor to at least about 0.1 V below a voltage potential of the ground node.

14. The apparatus of claim 12, further comprising controlling a leakage current of the switch transistor as a function of a biasing voltage potential applied to the gate of the switch transistor.

15. The method of claim 12, further comprising:
    providing a plurality of such digital circuits, each digital circuit having a respective virtual ground node;
    providing at least one such switch transistor coupled from each of the virtual ground nodes to the ground node; and
    independently disabling one or more of the digital circuits by biasing the gate terminal(s) of the associated switch transistor(s) below the voltage potential of the ground node.

16. The method of claim 12, wherein:

at least some of the digital circuits comprise a plurality of processors, each processor: (i) being capable of operative communication with a main memory, (ii) being implemented using a plurality of transistors in the silicon-on-insulator (SOI) arrangement, and (iii) having at least some of its transistors referenced to a respective virtual ground node;

the at least one switch transistor includes at least one switch transistor coupled from each of the virtual ground nodes to a ground node of the power supply for the processors; and the method includes independently disabling the processors by biasing gate terminal(s) of the respective switch transistor(s) below a voltage potential of the ground node.

* * * * *